United States Patent
Cusdin et al.

Patent Number: 5,697,093
Date of Patent: Dec. 9, 1997

[54] ZERO IF RECEIVERS

[75] Inventors: Anthony Richard Cusdin, deceased, late of Horley, by Linda Mary Cusdin, executrix; Alan J. Davie, Orpington; Paul A. Moore, Seaford, all of England

[73] Assignee: U.S. Philips Corporation, New York, N.Y.

[21] Appl. No.: 506,138

[22] Filed: Jul. 24, 1995

[30] Foreign Application Priority Data

Jul. 27, 1994 [GB] United Kingdom ............ 9415120

[51] Int. Cl.$^6$ ............................................ H04B 1/30
[52] U.S. Cl. ............................................ 455/324; 455/306
[58] Field of Search .................... 455/234.1, 266, 455/242, 307, 324, 338, 340, 306, 339; 333/212, 213, 214

[56] References Cited

U.S. PATENT DOCUMENTS

| | | | |
|---|---|---|---|
| 4,914,408 | 4/1990 | Voorman | 455/306 |
| 5,179,731 | 1/1993 | Trankle et al. | 455/324 |
| 5,263,192 | 11/1993 | Mittel et al. | 455/339 |
| 5,263,194 | 11/1993 | Ragan | 455/324 |
| 5,317,217 | 5/1994 | Rieger et al. | 307/521 |

FOREIGN PATENT DOCUMENTS

| | | |
|---|---|---|
| 0576084 | 12/1993 | European Pat. Off. . |
| 86/07215 | 12/1986 | WIPO . |
| 90/13175 | 11/1990 | WIPO . |

*Primary Examiner*—Reinhard J. Eisenzopf
*Assistant Examiner*—Sam Bhattacharya
*Attorney, Agent, or Firm*—Michael E. Marion

[57] ABSTRACT

An automatic gain control strategy for zero IF receivers in which the gain of low pass filters (20,22) is altered whilst keeping their bandwidths substantially constant. The low pass filters (20,22) are implemented as gyrator filters, each of which comprise at least one pair of transconductors, the ratio of the transconductances of which are adjustable in such a manner as to maintain the product of their transconductances constant. An electronic signal for adjusting the ratio of the transconductances is derived from an estimate of the instantaneous signal amplitude of the received signal.

8 Claims, 2 Drawing Sheets

5,697,093

1

ZERO IF RECEIVERS

BACKGROUND OF THE INVENTION

The present invention relates to improvements in or relating to zero IF receivers and particularly but not exclusively to gain control in zero IF receivers.

A known technique for automatic gain control (AGC) in zero IF receivers comprising quadrature related mixers, the I and Q outputs of which are obtained by deriving the difference signals from the products of mixing using low pass filters, is to amplify the signals in respective gain controlled amplifiers, to obtain the sum of the squares of the I and Q signals which provides an estimate of the instantaneous signal amplitude of the received signal and to apply this signal to the gain control inputs of the amplifiers. Frequently the gain controlled amplifiers precede the low pass filters. In this case, the gain control signal for the amplifiers is derived from the instantaneous output levels of the filters. One disadvantage of doing this is that if the filters are high order filters then the feedback circuit is prone to instability. The instability problem has been overcome by introducing another filter located in the gain control feedback path to the amplifiers. The cut off frequency of this additional filter is much lower than that of the other filters and has the effect of making the loop response very slow. As a result the AGC circuit is unable to respond quickly to large signal increases which leads to overloading of the circuit. However, as the overall circuit behaves as a first order system it is very stable.

SUMMARY OF THE INVENTION

It is an object of the present invention to provide an AGC circuit having a fast response but with the stability of a first order system.

According to the present invention there is provided a zero IF receiver comprising first and second quadrature related frequency down conversion stages, outputs of the first and second frequency down conversion stages being coupled to respective first and second gyrator IF filtering stages, means coupled to outputs of the first and second gyrator IF filtering stages for deriving an estimate of the instantaneous signal amplitude of the received signal, an output of said means being coupled to gain controlled inputs of said first and second gyrator IF filtering stages, wherein each of the first and second gyrator IF filtering stages comprise at least one pair of transconductors, the ratio of the transconductances of which are adjustable in such a manner as to maintain the product of their transconductances constant.

In an embodiment of the zero IF receiver a gain control circuit comprising the combination of a sum of the squares circuit and gyrator filters has been found to given an AGC circuit in which the gain can be varied with the bandwidth of the filters remaining substantially unchanged. Furthermore, the stability of the feedback system remains comparable to that of a first order system in spite of the filters being of a higher order. Hence the filters can be of any desired selectivity without any adverse implications on the AGC loop.

BRIEF DESCRIPTION OF THE DRAWINGS

The present invention will now be described, by way of example, with reference to the accompanying drawings, wherein.

2

Figure 2:
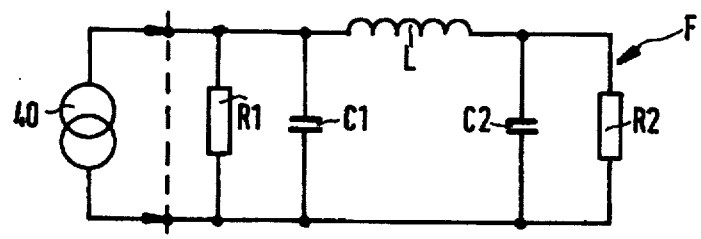
Figure 3:
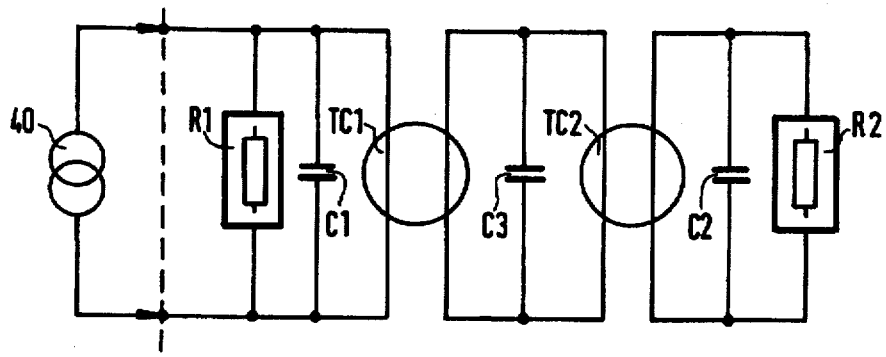
Figure 5:
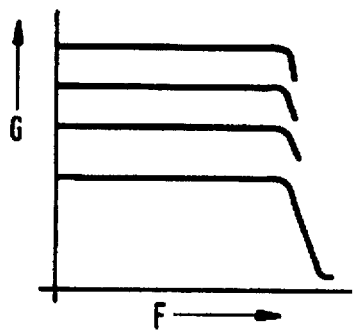
Figure 4:
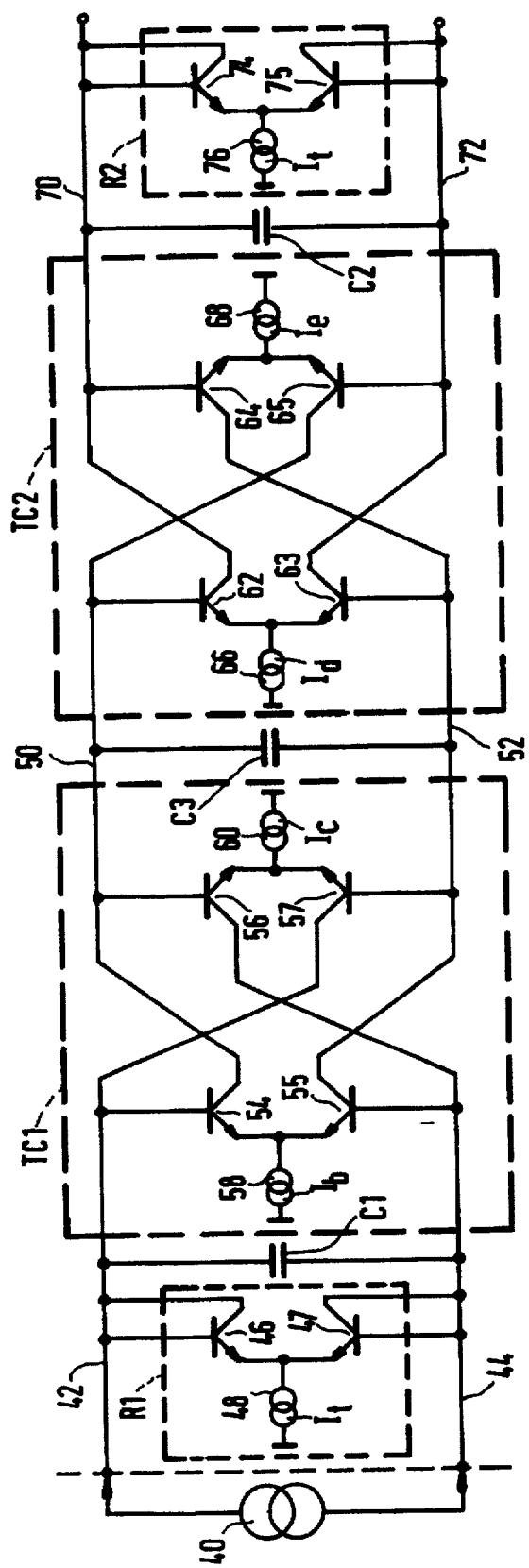

FIG. 2 is a schematic circuit diagram of an LC low pass filter;

FIG. 3 is a schematic circuit diagram of the filter shown in FIG. 2 in which the inductance is simulated using a gyrator filter;

FIG. 4 is a schematic circuit diagram of an implementation of a filter shown in FIG. 3; and FIG. 5 shows a series of curves of frequency F versus G illustrating the variation in gain of the substantially constant bandwidth filter.

In the drawings the same reference numerals have been used to indicate corresponding features.

DETAILED DESCRIPTION OF THE PREFERRED EMBODIMENTS OF THE INVENTION

Figure 1:
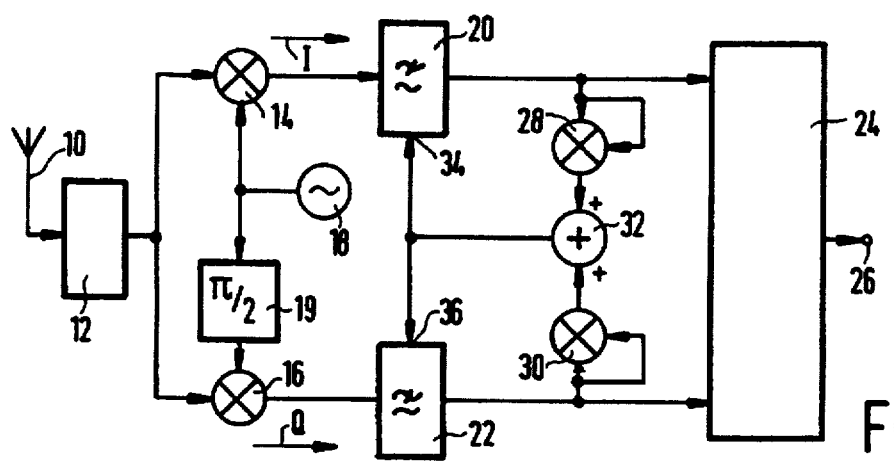
FIG. 1 is a block schematic diagram of a zero IF receiver in accordance with the present invention.

The zero IF receiver shown in FIG. 1 comprises an antenna 10 connected to an rf front end 12 which depending on the implementation of the receiver may comprise simply an rf amplifier providing an rf output signal or a frequency down conversion stage providing an IF output signal. The output from the stage 12 is divided into two quadrature related paths I and Q. Each of these paths is identical and comprises a mixer 14,16 in which the output from the stage 12 is frequency down converted to a zero IF using quadrature related local oscillator (LO) signals. The quadrature related LO signals are produced by means of a local oscillator generator 18, the output of which is connected to the mixer 14 and to a ninety degree phase shifter 19 which is connected to the mixer 16. The outputs of the mixers 14,16 are connected to respective low pass filters 20,22 which are implemented as gyrator filters (to be described with reference to FIGS. 3 and 4) and apply gain control to the signals therein. The outputs of the filters 20,22 are connected to a demodulator 24 which has a signal output 26. In order to effect gain control an estimate of the instantaneous signal amplitude of the signal at the outputs of the filters 20,22 is obtained by a sum of squares arrangement comprising multipliers 28,30 having two inputs both of which are connected to the respective signal paths from the filters 20,22 to the demodulator. A summing circuit 32 combines the outputs of the multipliers 28,30 and provides a sum of squares output which is applied to gain control inputs 34,36 of the filters 20,22 respectively.

FIG. 2 illustrates a circuit diagram of a filter F implemented using passive components. The filter F comprises a series inductance L which is shunted by capacitors C1,C2 and resistive devices R1,R2. A current source 40 representing an input signal shunts the parallel R1,C1 combination.

In accordance with the present invention the LC filter shown in FIG. 2 is implemented as a gyrator filter, shown in FIG. 3, in which the inductance is simulated by a capacitor C3 and transconductors TC1 and TC2. The resistive devices R1,R2 have been shown in rectangles because they are implemented as long tailed pair transconductor circuits as shown in FIG. 4.

Referring to FIG. 4, the filter circuit is driven from a current source 40 connected between supply lines 42,44. The resistive device R1 comprises NPN transistors 46,47 whose emitter electrodes are connected jointly to a current source 48 providing a current $I_r$. The collector and base electrodes of the transistors 46,47 are respectively connected to the supply lines 42,44. The capacitor C1 is connected between the supply lines 42,44. The transconductor TC1 comprises two pairs of long tail connected NPN transistors 54,55 and 56,57. The emitter electrodes of the transistors 54,55 are connected jointly to a current source 58 providing a current $I_b$. The collector electrodes of the transistors 54,55 are connected to lines 50,52 respectively. The emitter electrodes of the transistors 56,57 are connected jointly to a current source 60 providing a current $I_c$. The base electrodes of the transistors 56,57 are connected respectively to the lines 50,52 and the collector electrodes of these transistors are respectively connected to the lines 44,42.

A capacitor C3 is connected between the lines 50,52.

The transconductor TC2 comprises two pairs of long tail connected NPN transistors 62,63 and 64,65. The emitter electrodes of the transistors 62,63 are connected jointly to a current source 66 providing a current $I_d$. The collector electrodes of the transistors 62,63 are connected to lines 70,72 respectively. The emitter electrodes of the transistors 64,65 are connected jointly to a current source 68 providing a current $I_e$. The base electrodes of the transistors 64,65 are connected respectively to the lines 70,72 and the collector electrodes of these transistors are respectively connected to the lines 52,50.

The capacitor C2 is connected between the lines 70,72.

The resistive device R2 comprises NPN transistors 74,75 whose emitter electrodes are connected jointly to a current source 76 providing a current $I_f$. The collector and base electrodes of the transistors 74,75 are respectively connected to the lines 70,72.

On examination of the circuit shown in FIG. 4, to retain a constant filter cut off frequency the product $I_b.I_c=I_f^2$

| | |
|---|---|
| also | $I_d.I_e=I_f^2$ |
| hence | $I_b.I_c=I_d.I_e$ |
| Also by making | $I_b=I_d$ |
| and | $I_c=I_e$ | the product and therefore the filter cut off frequency is constant.

Thus by altering, say, $I_b$ and $I_c$ (and similarly $I_d$ and $I_e$) so that the product is constant, for example halving one value and doubling the other value, the circuit gain G can be varied without substantially altering the filter cut-off frequency. This is illustrated by the curves shown in FIG. 5.

Referring to FIG. 1 the sum of squares signal from the summing circuit 32 is used to alter the current supplied by the sources 58,60 and/or 66,68 in such a way that each can be varied while ensuring that their product remains constant.

Depending on the order of the filter depends on the number of means for varying the gain. For example a third order filter has two means of varying gain, a fifth order filter has four means of varying gain and a nth order filter has (n−1) means of varying gain. Irrespective of the order of the filter, the order seen around the feedback loop shown in FIG. 1 is first order and by established feedback theory the loop is stable. The gain control loop is nevertheless able to respond rapidly to changes in signal amplitude.

From reading the present disclosure, other modifications will be apparent to persons skilled in the art. Such modifications may involve other features which are already known in the design, manufacture and use of zero IF receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A zero IF receiver comprising first and second quadrature related frequency down conversion stages, outputs of the first and second frequency down conversion stages being coupled to respective first and second symmetrical gyrator IF filtering stages, means coupled to outputs of the first and second symmetrical gyrator IF filtering stages for deriving an estimate of instantaneous signal amplitude of a received signal, an output of said means being coupled to gain control inputs of said first and second symmetrical gyrator IF filtering stages, wherein each of the first and second symmetrical gyrator IF filtering stages comprises at least one pair of transconductors, and the gain of each said symmetrical gyrator IF filtering stage is controlled by adjusting the ratio of the transconductances of each pair of transconductances thereof in a manner so as to maintain the product of the transconductances of each said pair substantially constant.

2. A receiver as claimed in claim 1, characterized in that said means for deriving an estimate of the instantaneous signal amplitude comprises means for determining the sum of the squares of the signal amplitudes at the outputs of the first and second gyrator IF filtering stages.

3. A receiver as claimed in claim 1, characterized in that the number of pairs of transconductors whose ratio of transconductances is adjusted is one less than the order of the filtering stages.

4. A receiver as claimed in claim 1, characterized in that said means for deriving an estimate of the instantaneous signal amplitude comprises means for determining the sum of the squares of the signal amplitudes at the outputs of the first and second gyrator IF filtering stages and in that the number of pairs of transconductors whose ratio of transconductances is adjusted is one less than the order of the filtering stages.

5. A zero IF receiver comprising first and second quadrature related frequency down conversion stages, each said stage having an output, first and second symmetrical gyrator IF filtering stages coupled to respective outputs of the first and second frequency down conversion stages, means coupled to the first and second symmetrical gyrator IF filtering stages for deriving an estimate of the instantaneous signal amplitude of the received signal, each of the first and second symmetrical gyrator IF filtering stages comprising at least one pair of transconductors, each of the transconductors of said at least one pair comprising first and second cross connected long tailed pair transconductor circuits and third and fourth cross connected long tailed pair transconductor circuits, the transconductances of the first, second, third and fourth transconductor circuits being adjusted in response to signals from said estimate deriving means to control the gains of the first and second symmetrical gyrator IF filtering stages, said gains being altered by adjusting the ratio of the transconductances of the first and second cross connected long tailed pair transconductor circuits and adjusting the ratio of the transconductances of the third and fourth cross connected long tailed pair transconductor circuits in such a manner as to maintain the product of the transconductances of said first and second transconductor circuits substantially constant and the product of the transconductances of said third and fourth transconductor circuits substantially constant.

6. A receiver as claimed in claim 5, characterized in that said means for deriving an estimate of the instantaneous signal amplitude comprises means for determining the sum of the squares of the signal amplitudes at the outputs of the first and second gyrator IF filtering stages.

7. A receiver as claimed in claim 5, characterized in that the number of pairs of transconductors whose ratio of transconductances is adjusted is one less than the order of the filtering stages.

8. A receiver as claimed in claim 5, characterized in that said means for deriving an estimate of the instantaneous signal amplitude comprises means for determining the sum of the squares of the signal amplitudes at the outputs of the first and second gyrator IF filtering stages and in that the number of pairs of transconductors whose ratio of transconductances is adjusted is one less than the order of the filtering stages.

* * * * *